(12) United States Patent
Sawahata

(10) Patent No.: US 6,684,181 B1
(45) Date of Patent: Jan. 27, 2004

(54) ION IMPLANTATION SIMULATION METHOD

(75) Inventor: Koichi Sawahata, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/310,450

(22) Filed: May 12, 1999

(30) Foreign Application Priority Data

May 15, 1998 (JP) .......................................... 10-133060

(51) Int. Cl.[7] .............................. G06F 7/60; G06F 7/48
(52) U.S. Cl. ................................. 703/2; 703/6; 703/13; 703/12
(58) Field of Search ............................ 703/2, 6, 12, 13

(56) References Cited

U.S. PATENT DOCUMENTS

| | | | | |
|---|---|---|---|---|
| 5,719,796 A | * | 2/1998 | Chen ........................... | 700/108 |
| 5,784,302 A | * | 7/1998 | Kumashiro ................... | 703/13 |
| 5,787,269 A | * | 7/1998 | Hyodo ......................... | 700/103 |
| 5,859,784 A | * | 1/1999 | Sawahata .................... | 703/13 |
| 5,933,359 A | * | 8/1999 | Sawahata .................... | 703/5 |
| 5,999,719 A | * | 12/1999 | Asada et al. ................. | 700/73 |
| 6,036,346 A | * | 3/2000 | Hino et al. .................. | 700/121 |
| 6,099,574 A | * | 8/2000 | Fukuda et al. ............... | 703/14 |
| 6,185,472 B1 | * | 2/2001 | Onga et al. .................. | 438/486 |

FOREIGN PATENT DOCUMENTS

| | | | |
|---|---|---|---|
| JP | HEI 9-45630 | 2/1997 | |
| JP | 09-45630 | * 2/1997 | ..................... 703/2 |

OTHER PUBLICATIONS

"Advanced Analytical Ion Implantation Models in ATHENA", vol. 7, No. 12, Dec. 1996, Silvaco.*
Hobler et al., "Two–Dimensional Modeling of Ion Implantation Induced Point Defects", IEEE 1988.*
Tabatabaie et al., "Channeling, Exponential Tails, and Analytical Modeling of Si Implants into GaAs", IEEE 1990.*
Tasch et al., "Accurate Profile Simulation Parameters for BF2 Implants in Pre–amorphized Silicon", IEEE 1989.*
Mulvaney et al., "PEPPER–A Process Simulator for VLSI", IEEE 1989.*
Zhou, "The Essence of Process Simulation" Siminar on TCAD and TSUPREM–4 Process Simulation, 1997.*
Zhou et al., "Introduction to Process and Device Simulation with TSUPREM–4 and MEDICI", Worshop on TSUPREM–4 and MEDICI, 1996.*
Ion–Implantation Model Considering Crystal Structure Effects, IEDM (1988).

* cited by examiner

Primary Examiner—William Thomson
(74) Attorney, Agent, or Firm—Scully, Scott, Murphy & Presser

(57) ABSTRACT

The results of conventional analytical ion implantation simulation for the point defect distribution, for a silicon substrate on which an oxide layer or a nitride layer is formed, differ from the results of the Monte Carlo ion implantation simulation method. According to the present invention, it is unnecessary to distinguish between layers of materials in which point defects are or are not generated when determining the point defect distribution because, although point defects do not occur in some materials, such as oxides or nitrides, layers of these materials undergo the same amount of damage by ion implantation as layers of a material in which point defects are generated, such as silicon. Therefore, in the present invention, when carrying out simulations under ion implantation conditions in which channeling is inhibited, whether for a substrate having a layer of a material in which point defects usually are not generated, such as an oxide or a nitride, or for a substrate not having a layer of such a material, the point defect distribution simulation (steps 14 and 15) uses the same distribution as for a layer of a material in which point defects are generated.

5 Claims, 4 Drawing Sheets

Fig. 2 PRIOR ART
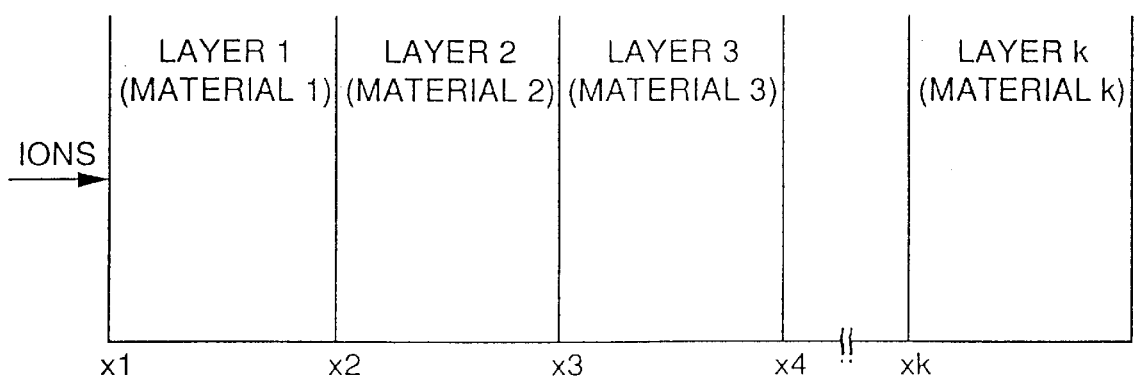
Fig. 5
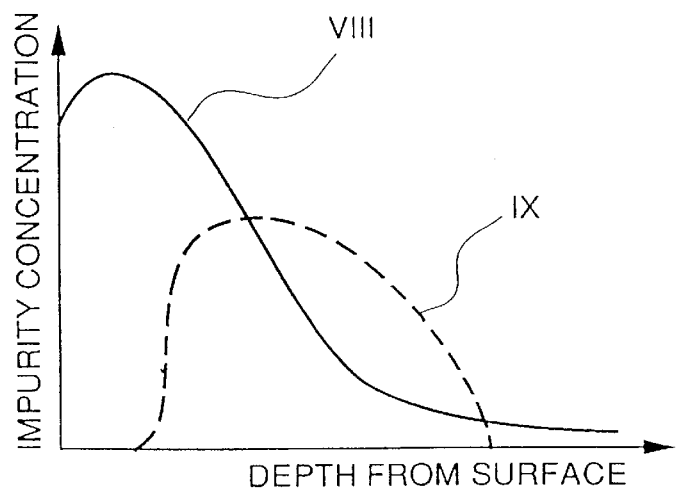

ION IMPLANTATION SIMULATION METHOD

BACKGROUND OF THE INVENTION

1. Field of the Invention

The present invention relates to an ion implantation simulation method, and especially relates to an ion implantation simulation method for determining by simulation the impurity distribution and point defect distribution when carrying out ion implantation for a multilayer substrate used in the production of semiconductors.

2. Background Art

In semiconductor device manufacturing processes, ion implantation is widely used to form impurity regions in semiconductor substrates. In order to suitably carry out such ion implantation, there is a need to know in advance how the concentration of ions in the substrate will be distributed, in other words, to ascertain what the impurity distribution will be, and what the distribution of point defects in the substrate will be, and for this purpose, ion implantation simulations are carried out to determine, by means of the simulation, the impurity distribution and the point defect distribution.

The conventional ion implantation simulation method for determining the impurity distribution and point defect distribution in a multilayer substrate shown in FIG. 2 is carried out as follows. In FIG. 2, in a multilayer substrate composed of layers from the first to the k-th layers, k=1 is set and $Q_1$ is set as the dose implanted into the first layer, next it is judged whether k>(the number of layers), and if k>(the number of layers), the procedure is stopped, and if k≦(the number of layers), a Gaussian distribution, a combined Gaussian distribution, a Pearson distribution, a dual Pearson distribution or the like is used to determine the normalized impurity distribution $I_k(x)$ in the material of the k-th layer. If the impurity distribution $I_k(x)$ is obtained using a Gaussian distribution, the impurity distribution $I_k(x)$ is expressed by the following equation.

$$I_k(x) = \frac{C_k}{\sqrt{2\pi}\,\sigma_k} \exp\left[\frac{-(x-Rp_k)^2}{2\sigma_k^2}\right] \quad \text{Eq. (1)}$$

In Eq. (1), $Rp_k$ is the range of ions defined for the material of the k-th layer for obtaining the impurity distribution, $\sigma_k$ is a moment defined for the material of the k-th layer used for obtaining the impurity distribution, and x represents the coordinate in the depthwise direction. Further, $C_k$ is determined so as to satisfy the following equations, when $XS_k$ is the transformed surface coordinate of a layer for which the material is converted into that of the k-th layer of the device, $$\int_{x_k}^{\infty} I_k(x-xs)\,dx = 1 \quad \text{Eq. (2)}$$

$$xs_k = x_i + \sum_{i=1}^{k-1}\left(1 - \frac{Rp_k}{Rp_i}\right)di \quad \text{Eq. (3)}$$

where, in Eq. 3, $d_i$ is the width (layer thickness) of the i-th layer, and $d_i = x_{i+1} - x_i$. Then, the impurity distribution in the k-th layer $f_k(x)$ is determined by the following equation.

$$f_k(x) = Q_k I_k(x-xs_k) \quad \text{Eq. (4)}$$

Next, the point defect distribution is determined. The point defect distribution can be determined by the following equation, which corresponds to the Eq. (35) of Japanese Unexamined Patent Application, First Publication No. Hei 9-45630, previously proposed by the inventor of the present invention.

$$f_{dk}(x) = F_k Q_k J_{dk}\left(x - \left(\sum_{i=1}^{k-1} d_i\left[1 - \frac{Rp_k}{Rp_i}\right]\right) - (-Rp_k + Rp_{dk})\right) \quad \text{Eq. (5)}$$

Here, in Eq. (5), $f_{dk}(x)$ is the point defect distribution in the k-th layer, $F_k$ is (the total amount of point defects)/(the total amount of impurities), $Q_k$ is, as mentioned above, the dose of impurities in the k-th layer, $J_{dk}(x)$ is the normalized point defect distribution calculated from the moments $Rp_k$, $\sigma_{dk}$, $\gamma_{dk}$, and $\beta_{dk}$; and $\sigma_{dk}$, $\gamma_{dk}$, $\beta_{dk}$ are moments defined for the material of the k-th layer used for obtaining the point defect distribution, respectively representing the standard deviation, distortion and sharpness. Further, $Rp_{dk}$ is a range defined for the material of the k-th layer used for obtaining the point defect distribution.

The normalized point defect distribution $J_{dk}$ used in Eq. (5) is defined as being calculated from the moments $Rp_k$, $\sigma_{dk}$, $\gamma_{dk}$, and $\beta_{dk}$, but this definition is unnatural because these moments are a mixture of moments in terms of the impurity distribution and moments in terms of the point defect distribution, therefore a new function referred to as $I_{dk}$ will be explained, in which the definition of the normalized point defect distribution is calculated from $Rp_{dk}$, $\sigma_{dk}$, $\gamma_{dk}$, and $\beta_{dk}$. In this way, the relationship between $J_{dk}(x)$ and $I_{dk}(x)$ is $$I_{dk}(x) = J_{dk}(x + Rp_k - Rp_{dk}) \quad \text{Eq. (6)}$$

and Eq. (5) can be rewritten as follows.

$$f_{dk}(x) = F_k Q_k I_{dk}\left(x - \left(\sum_{i=1}^{k-1} d_i\left[1 - \frac{Rp_k}{Rp_i}\right]\right)\right) \quad \text{Eq. (7)}$$

Here, by analogy to the impurity distribution $f_k(x)$ which is $$\int_{x_k}^{\infty} f_k(x)\,dx = Q_k \quad \text{Eq. (8)}$$

the point defect distribution $f_{dk}(x)$ is defined by the following equation.

$$\int_{x_k}^{\infty} f_{dk}(x)\,dx = F_k Q_k \quad \text{Eq. (9)}$$

As a result, the normalized point defect distribution $I_{dk}$ is obtained by the following equation.

$$\int_{x_k}^{\infty} I_{dk}\left(x - \left(\sum_{i=1}^{k-1} d_i\left[1 - \frac{Rp_k}{Rp_i}\right]\right)\right)dx = 1 \quad \text{Eq. (10)}$$

As a result, the point defect distribution in, for example, the second layer can be obtained by eliminating $Q_k$ using both Eqs. (8) and (9), and by setting k=2, as follows.

$$\int_{x2}^{\infty} f_{d2}(x)\,dx = F_2 \int_{x2}^{\infty} f_2(x)\,dx \qquad \text{Eq. (11)}$$

This ion implantation simulation method, proposed by the present inventor, is an analytical simulation method which is carried out using analytical equations such as Gaussian distributions, combined Gaussian distributions, and Pearson distributions.

On the other hand, the Monte Carlo ion implantation simulation method is also disclosed in the literature (Masami Hane and Masao Fukuma, "Ion Implantation Model Considering Crystal Structure Effects", IEDM (1988)) as a method of ion implantation simulation. In the Monte Carlo ion implantation simulation method, as ions are implanted into the semiconductor substrate and the implanted ions advance, they are subjected to scattering by atomic nuclei, and to energy loss, and they are further subjected to energy loss by scattering by electrons present around the nuclei. Such a process is simulated for one particle at a time, and it is possible to obtain the impurity distribution after ion implantation by calculating the distribution of particles finally remaining in the semiconductor substrate.

Further, it is possible to calculate the distribution of point defects such as vacancies or interstitial atoms in a crystal after ion implantation by simulating the process by which ions expel electrons which constitute the crystal lattice.

In the Monte Carlo ion implantation simulation method, a simulation of the scattering process is made for each implanted ion, one at a time, and therefore, there is the problem that it takes a long time to obtain the results of the simulation. The present inventor disclosed an ion implantation simulation method in Japanese Unexamined Patent Application, First Publication No. Hei 9-45630, which makes it possible to obtain, in a short time, simulation results of the impurity distribution and point defect distribution by the above-mentioned analytical ion implantation simulation method.

However, in the Monte Carlo ion implantation simulation method, for ion implantation carried out in conditions in which channeling does not occur, the point defect distributions obtained for a silicon substrate when an oxide film or nitride film is present, and when no oxide film or nitride film is present, are almost the same. In contrast, in the ion implantation simulation method disclosed in the above publication, if an oxide film or nitride film is formed on the silicon substrate, the point defect distribution in the silicon substrate changes, and as a result, the point defect distribution differs from that obtained by the Monte Carlo ion implantation simulation method.

For example, as shown in FIG. 4, the impurity distribution labeled III and the point defect distribution labeled IV were obtained by the Monte Carlo ion implantation simulation method, while the ion implantation simulation method disclosed in the above publication provided the impurity distribution labeled V, which does not differ significantly from the impurity distribution III provided by the Monte Carlo ion implantation simulation method, and provided the point defect distribution labeled VI, which differs from the point defect distribution IV provided by the Monte Carlo ion implantation simulation method. This is because, when there is a nitride layer or an oxide layer on the silicon substrate, the results of the analytical simulation differ from the point defect distribution in the silicon substrate.

BRIEF SUMMARY OF THE INVENTION

The present invention was made in consideration of the above points, with the objective of providing an analytical ion implantation simulation method, which can provide point defect simulation results for semiconductor substrates which are almost the same as those of the Monte Carlo ion implantation simulation method, even if there is an oxide or nitride on the semiconductor substrate.

To accomplish the above objective, the ion implantation simulation method of the present invention determines by analytical equations the impurity distribution and the point defect distribution for each layer, and simulates the point defect distribution resulting from ion implantation carried out on a multilayer substrate, by generating a point defect distribution $f_{dk}(x)$, related to the impurity distribution $f_k(x)$ by the following equation $$\int_{xs_k}^{\infty} f_{dk}(x)\,dx = F_k \int_{xs_k}^{\infty} f_k(x)\,dx \qquad (A)$$

(wherein $f_{dk}(x)$ is the actual point defect distribution of the k-th layer, $f_k(x)$ is the impurity distribution of the k-th layer, $F_k$ is (amount of point defects)/(amount of impurities) for the k-th layer, x is the coordinate in the depthwise direction in the multilayer substrate, $xs_k$ is the transformed surface coordinate of a layer for which the material is converted into that of the k-th layer of the substrate).

The above $F_k$ is a value calculated in advance using the equation $$F_k = \frac{\int_0^{\infty} f_d(x)\,dx}{\int_0^{\infty} f(x)\,dx} \qquad (B)$$

from the impurity distribution $f(x)$ and the point defect distribution $f_d(x)$ calculated by Monte Carlo ion implantation simulation for conditions in which channeling does not occur, for a bare semiconductor substrate or a semiconductor substrate with a thin film on its surface of a material in which point defects do not occur.

Further, to accomplish the above mentioned objective, when ion implantation is carried out for a multilayer substrate, the method of the present invention, which determines by analytical ion implantation simulation the impurity distribution and point defect distribution for each layer, comprises a first step of determining a normalized impurity distribution, a second step of calculating the actual impurity distribution from the normalized impurity distribution, a third step of determining a reference point defect distribution, only for layers of materials for which point defects occur, and a fourth step of calculating the actual point defect distribution for ion implantation conditions which inhibit channeling, from the reference point defect distribution.

The above fourth step calculates the actual point defect distribution using the actual impurity distribution determined in the second step, and the ratio of the amount of point defects to the amount of impurities, previously calculated from the impurity distribution and point defect distribution calculated by the Monte Carlo ion implantation simulation for conditions in which channeling does not occur.

Further, the above first step is characterized in that the normalized impurity distribution is determined using one of a Gaussian distribution, a Pearson distribution, or a dual Pearson distribution.

Furthermore, the above third step is characterized in that the reference point defect distribution is determined using one of a Gaussian distribution, a Pearson distribution and a dual Pearson distribution, and normalization of the point defect distribution is not carried out.

In the present invention, it is unnecessary to distinguish layers of materials in which point defects occur from those in which point defects do not occur in order to determine the point defect distribution, because layers of materials in which point defects normally do not occur, such as oxides and nitrides, are nonetheless subject to the same degree of damage by implanted ions as layers of materials in which point defects occur, such as silicon. Therefore, in the present invention, simulations for ion implantation conditions which inhibit channeling are carried out using the same distribution as for a material in which point defects are not generated, regardless of whether the substrate has or does not have layers of material in which point defects usually do not occur, such as nitrides or oxides. dr

BRIEF DESCRIPTION OF THE DRAWINGS

FIG. 2: A schematic diagram of the constitution of a multilayer substrate for ion implantation.

FIG. 5: A figure showing the dual Pearson distribution used in another embodiment of the ion implantation simulation method of the present invention.

DESCRIPTION OF THE PREFERRED EMBODIMENTS

Figure 1:
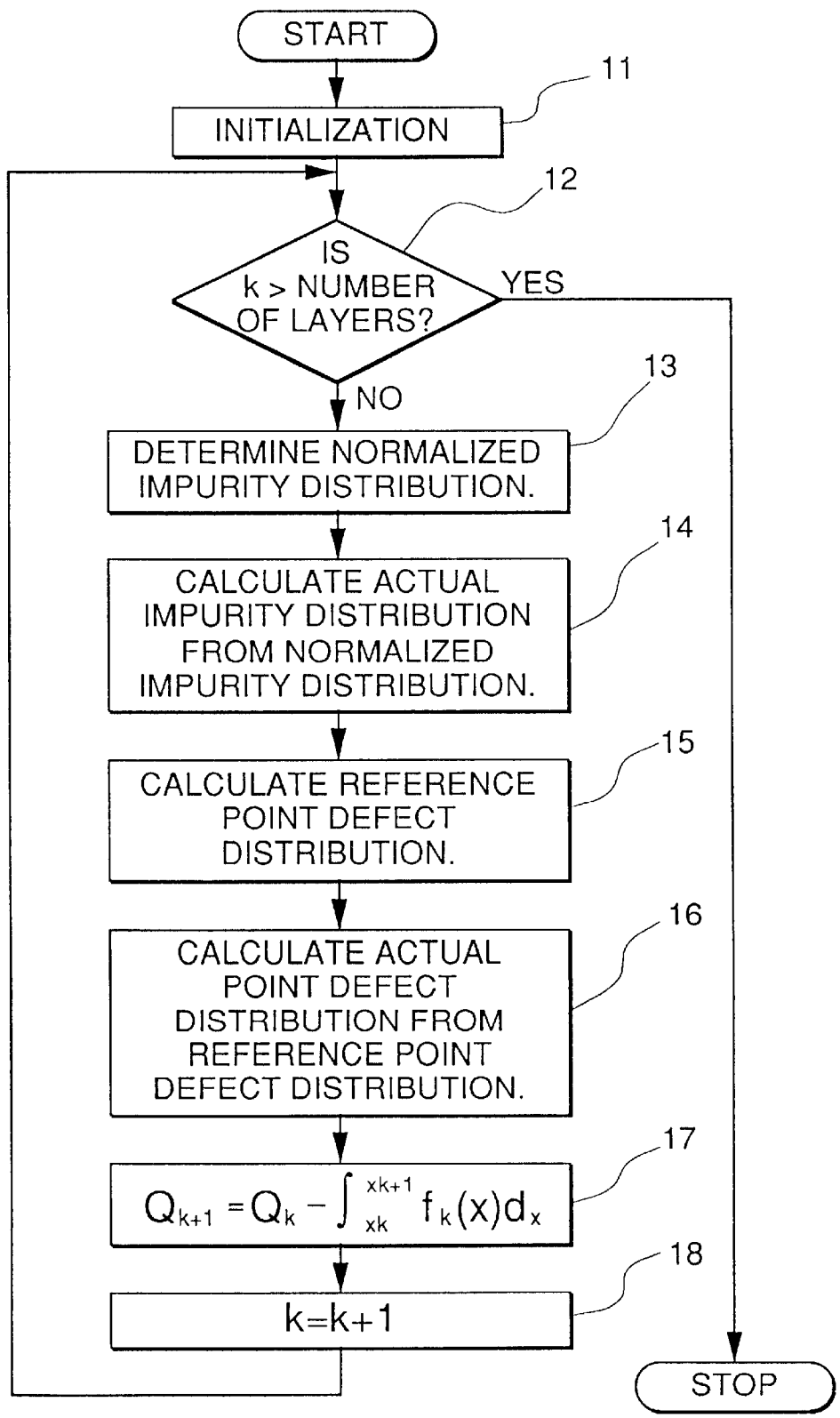
FIG. 1: Flowchart of an embodiment of the ion implantation simulation method of the present invention.

Next, embodiments of the present invention will be explained with reference to the drawings. FIG. 1 shows a flowchart of one embodiment of the ion implantation simulation method of the present invention. In this embodiment, the impurity distribution and point defect distribution for the ion implantation in a multilayer substrate having k layers are determined as shown in FIG. 2.

In FIG. 1, first, initialization is carried out (step 11). In this initialization, the initial value of the variable k is set to "1", and the implantation dose is set as $Q_1$. Next, it is determined whether the value of the variable k is greater than the number of layers of the multilayer substrate (step 12), and if k is smaller than the number of layers, a normalized impurity distribution $I_k$ is determined using a Gaussian distribution, combined Gaussian distribution, a Pearson distribution, or a dual Pearson distribution (step 13).

If the impurity distribution $I_k(x)$ is determined according to a Gaussian distribution, it can be expressed by the following equation.

$$I_k(x) = \frac{C_k}{\sqrt{2\pi}\,\sigma} \exp\left[\frac{-(x - Rp_k)^2}{2\sigma_k^2}\right] \qquad \text{Eq. (12)}$$

In Eq. (12), $Rp_k$ is the range of ions defined in the material of layer k for obtaining the impurity distribution, $\sigma_k$ is the standard deviation of the moment of the impurity distribution of the material of layer k, and x is the coordinate in the depthwise direction. Further, $C_k$ is a normalization constant, chosen such that when $xs_k$ is the transformed surface coordinate of a layer for which the material is converted to that of the k-th layer of the device, $$\int_{xs_k}^{\infty} I_k(x - xs_k)\,dx = 1 \qquad \text{Eq. (13)}$$

$$xs_k = x_i + \sum_{i=1}^{k-1}\left(1 - \frac{Rp_k}{Rp_i}\right)d_i \qquad \text{Eq. (14)}$$

is satisfied. In Eq. (14), $d_i$ is the width (layer thickness) of the i-th layer, and $d_i = x_{i+1} - x_i$.

Next, the actual impurity distribution $f_k(x)$ is calculated from the normalized impurity distribution $I_k(x)$ as follows (step 14).

$$f_k(x) = Q_k I_k(x - xs_k) \qquad \text{Eq. (15)}$$

The above steps 11 to 14 are the same as the analytical ion implantation simulation method previously disclosed by the present inventor.

Next, the point defect distribution $I_{dk}(x)$ to be used as a reference for the k-th layer is determined (step 15). Similarly to the impurity distribution, for determining the point defect distribution $I_{dk}(x)$ for the k-th layer by a Gaussian distribution, the following equation is used.

$$I_{dk}(x) = \frac{C_{dk}}{\sqrt{2\pi}\,\sigma_{dk}} \exp\left[\frac{-(x - Rp_{dk})^2}{2\sigma_{dk}^2}\right] \qquad \text{Eq. (16)}$$

In Eq. (16), $Rp_{dk}$ is the range of ions defined for the material for obtaining the point defect distribution for the k-th layer, $\sigma_{dk}$ is the standard deviation of the moment for the material of layer k for obtaining the point defect distribution, and x is the coordinate in the depthwise direction.

The point defect distribution does not necessarily have to be normalized, and $C_{dk}$ can be any number. Because of this, $I_{dk}$ in Eq. (16) can be called the reference point defect distribution, and not the normalized point defect distribution. Further, for a material in which point defects are not normally generated, such as an oxide film, the moments $Rp_{dk}$ and $\sigma_{dk}$ are not defined, and the process for calculating the reference point defect distribution of step 15 is not carried out.

Next, the actual point defect distribution $f_{dk}(x)$ is determined from the reference point defect distribution $I_{dk}(x)$ as follows (step 16).

$$f_{dk}(x) = Q_{dk} I_{dk}(x - xs_k) \qquad \text{Eq. (17)}$$

Here, $Q_{dk}$ is defined according to the following equation.

$$Q_{dk} = F_k Q_k \frac{\int_0^\infty I_k(x)\,dx}{\int_0^\infty I_{dk}(x)\,dx} \qquad \text{Eq. (18)}$$

This is the same as the definition according to the following equation.

$$\int_{xs_k}^{\infty} f_{dk}(x)\,dx = F_k \int_{xs_k}^{\infty} f_k(x)\,dx \qquad \text{Eq. (19)}$$

In Eq. (19), $F_k$, the ratio of (the amount of point defects)/(the amount of impurities) is a value which is calculated in advance, as follows, from the impurity distribution $f(x)$ and the point defect distribution $f_d(x)$ by Monte Carlo ion implantation simulation for conditions in which channeling does not occur, for a bare wafer or a wafer with a thin film of oxide or the like.

$$F_k = \frac{\int_0^\infty f_d(x)\,dx}{\int_0^\infty f(x)\,dx} \quad \text{Eq. (20)}$$

Namely, in this embodiment, as understood from Eq. (19), the point defect distribution $f_{dk}(x)$ of each layer is determined from the transformed surface coordinates of a layer for which the material is subject to the occurrence of point defects, and the point defect distribution is determined without making special distinctions for layers of materials in which point defects are not ordinarily generated, such as oxide layers or nitride layers.

Next, in order to determine the impurity distribution and point defect distribution of the next layer (the k+1 layer), the dose $Q_{k+1}$ of the next layer (the k+1 layer) is determined (step 17).

$$Q_{k+1} = Q_k - \int_{xk}^{xk+1} f_k(x)\,dx \quad \text{Eq. (21)}$$

Then, after incrementing the value of the variable k by only one (step 18), return to step 12, and it is determined by comparison whether the new value of k is larger than the number of layers of the multilayer substrate which is the object of the simulation. As below, the calculation process of steps 13–18 is completed (step 19) when it is determined that the value of the variable k is larger than the number of layers of the multilayer substrate which is the object of the simulation, after the calculation of the impurity distribution and the point defect distribution of each layer of the multilayer substrate.

Figure 3A:
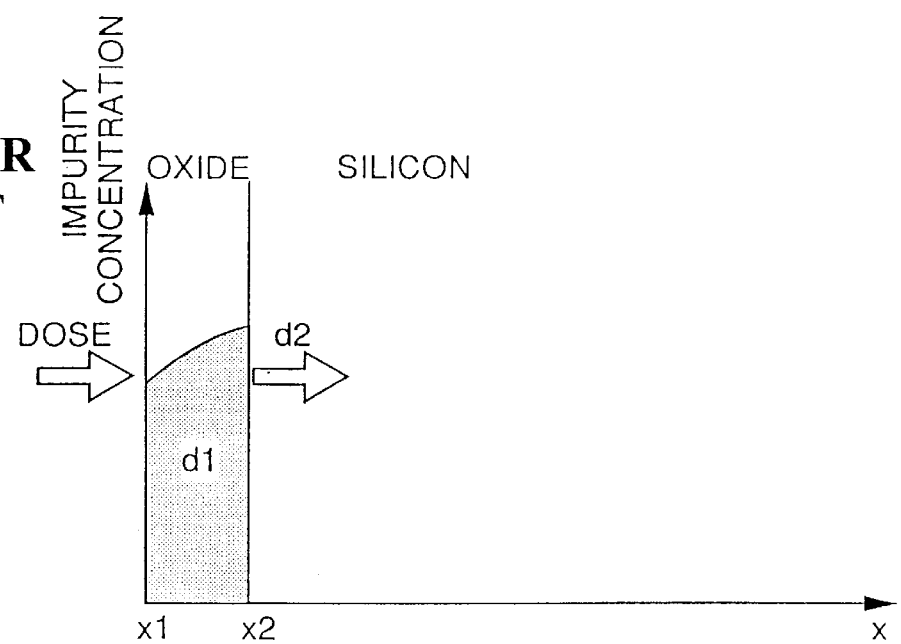
FIGS. 3A, 3B: Graphs explaining the determination of the impurity distribution and point defect distribution for a two layer substrate by the method of the present invention.
Figure 3B:
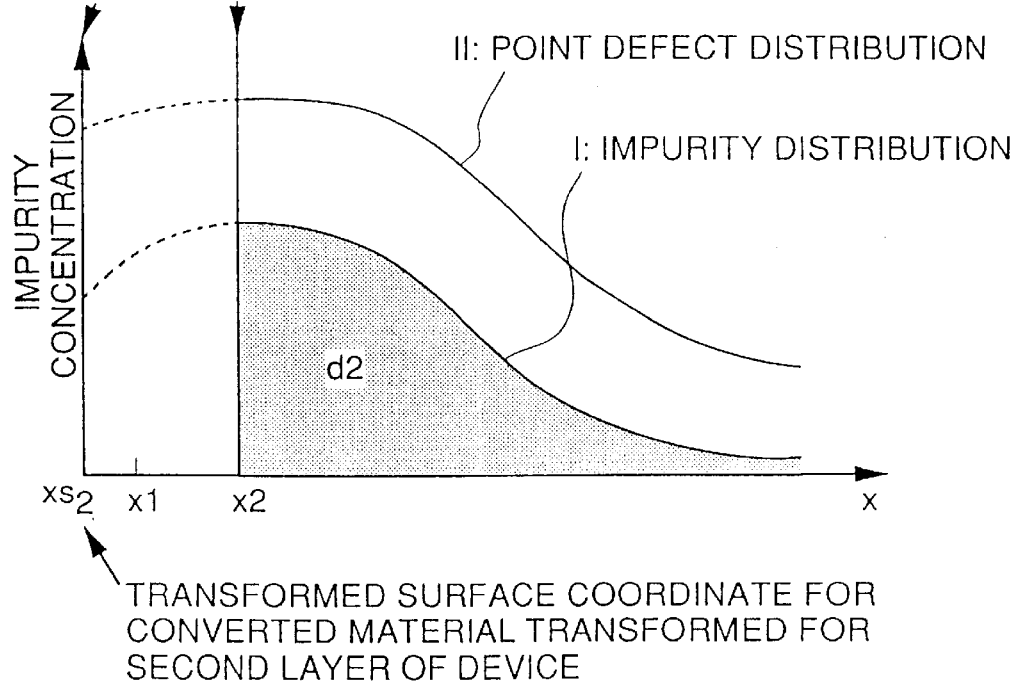

FIGS. 3A and 3B schematically show the shape determined for the impurity distribution and the point defect distribution for a two layer multiplayer substrate. First, as shown in FIG. 3A, the impurity distribution for the first layer is calculated. This first layer is an oxide (oxide film) having a thickness of $d_t=(x_2-x_t)$. Next, as shown in FIG. 3B, the effective thickness of a converted first layer is calculated, in which the material of the first layer is replaced with that of the second layer, which is silicon, and the transformed surface coordinate $xs_2$ is determined.

After this, the impurity distribution and point defect distribution of the second layer are calculated. At this time, for the point defect distribution, in Eq. (19), k is set to 2, so as to satisfy the following equation.

$$\int_{xs_2}^\infty f_{d2}(x)\,dx = F_2 \int_{xs_2}^\infty f_2(x)\,dx \quad \text{Eq. (22)}$$

In this way, it can be shown that, for a layer of a material which does not normally produce point defects such as the oxide or a nitride of the first layer, when determining the point defect distribution, it is unnecessary to distinguish the first layer of a material such as oxide or nitride from the silicon substrate of the second layer, because the first layer is subjected to the same degree of damage by ion implantation as the silicon substrate. Because of this, the presence or absence of an oxide or nitride does not affect the damage to the silicon layer, and has little influence on the point defect distribution. If the impurity distribution were changed, the point defect distribution in the silicon substrate would change, but in conditions in which channeling does not occur, the point defect distribution changes very little when the layer thickness of an oxide or a nitride is such that the distribution has the same peak position as that of the silicon substrate.

Figure 4:
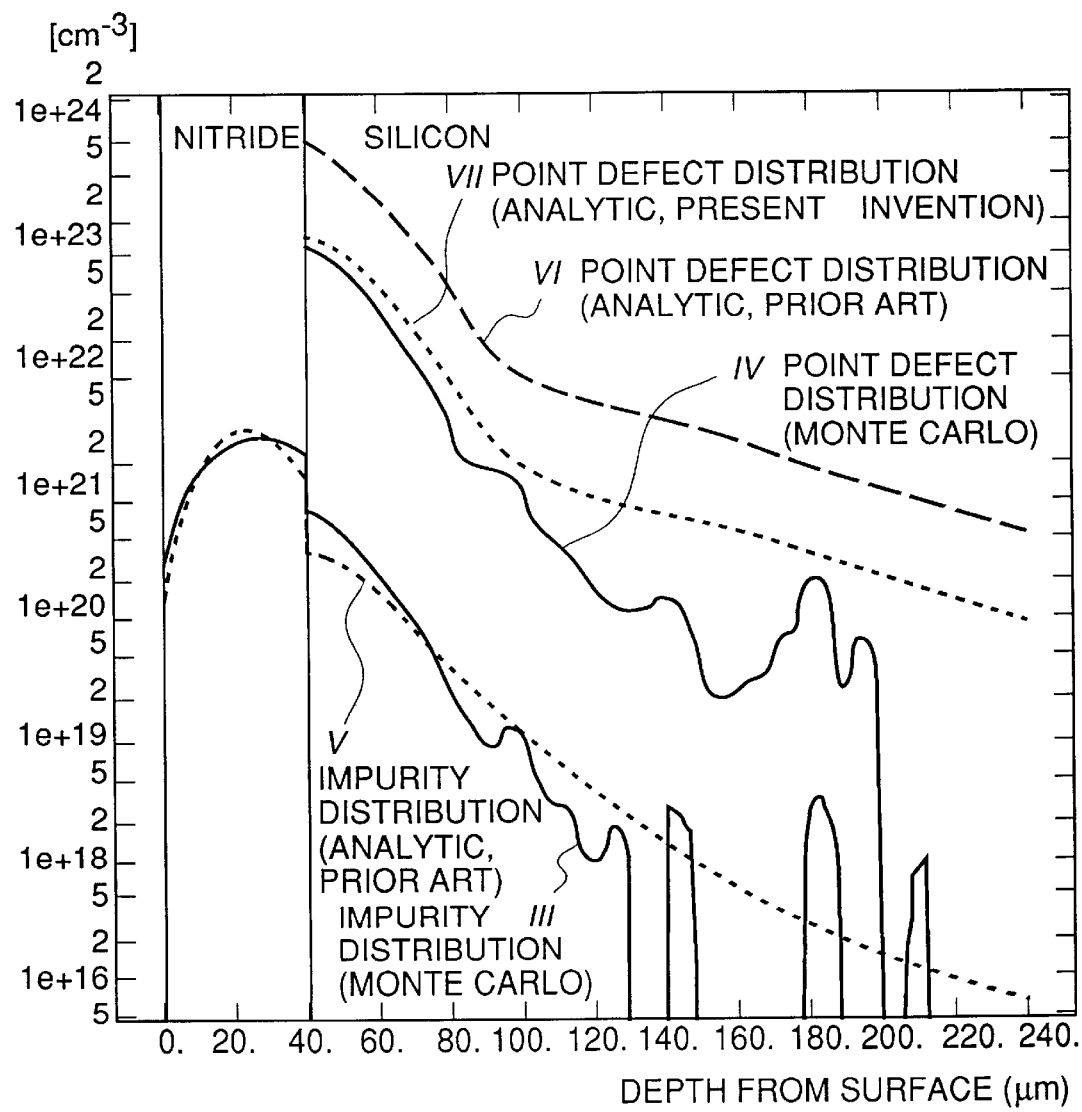
FIG. 4: A figure showing a comparison of the results of the simulation results for the point defect distribution by the method of the present invention, and the simulation results of the impurity distribution and point defect distribution by the Monte Carlo ion implantation simulation method.

In this embodiment, when determining the impurity distribution, because the calculations are carried out without distinguishing between the silicon substrate of the second layer and the oxide or nitride or the like of the first layer, as shown by VII in FIG. 4, it can be confirmed that the point defect distribution for the modified thickness of the oxide layer or nitride layer as determined according to the present embodiment is consistent with the point defect distribution IV determined by the Monte Carlo ion implantation simulation method of the prior art, especially near the peak.

Next, another embodiment of the present invention will be explained. In this embodiment, the point defect distribution, as shown in FIG. 5, was calculated using a dual Pearson distribution. A dual Pearson distribution is a addition of the Pearson distribution shown in FIG. 5 by VIII and the Pearson distribution shown by IX, and can express more complex distributions.

In this embodiment, step 15 in the above-mentioned FIG. 1 is executed as follows. First, $I1_{dk}(x)$ and $I2^{dk}(x)$, for the reference point defect distribution for layer k, are determined. Then the reference point defect distribution is determined as below, using $I1_{dk}(x)$, $I2^{dk}(x)$, and ratio$_{dk}$, which is one of the moments for the k-th layer, and which is used for obtaining the ratio for adding $I1_{dk}(x)$ and $I2^{dk}(x)$.

Assuming that the moments for the point defect distribution $I1_{dk}(x)$ of the k-th layer are $Rp1_{dk}$, $\sigma1_{dk}$, $\beta1_{dk}$, the point defect distribution $I1_{dk}(x)$ is calculated so as to satisfy these moments. Another point defect distribution $I2^{dk}(x)$, satisfying the moments defined for the k-th layer is then calculated in the same way. Furthermore, the point defect distributions $I1_{dk}(x)$ and $I2^{dk}(x)$ are defined to satisfy the following equation.

$$\int_{x2}^\infty I1_{dk}(x)\,dx = \int_{x2}^\infty I2_{dk}(x)\,dx \quad \text{Eq. (23)}$$

Next, the reference point defect distribution $I_{dk}(x)$ is determined according to the following equation.

$$I_{dk}(x) = \text{ratio}_{dk} I1_{dk}(x) + (1-\text{ratio}_{dk}) I2^{dk}(x) \quad \text{Eq. (24)}$$

The first term on the right hand side of Eq. (24) is the distribution VIII in FIG. 5, and the second term on the right hand side is the distribution IX in FIG. 5. By adding these terms, the reference point defect distribution $I_{dk}(x)$ can be obtained. However, for a layer of a material for which point defects are usually not defined, such as an oxide film or a nitride film, the moments for the point defects are not defined, and therefore, the calculation with the above-mentioned dual Pearson distribution is not carried out.

As explained above, according to the present invention, a new method of simulating ion implantation has been developed for conditions which inhibit channeling, to allow simulation of the point defect distribution for a substrate with a layer of a material in which point defects usually do not occur, such as an oxide or nitride, or for a substrate which does not have such a layer, and the point defect distribution in the layers in which point defects occur can be obtained by converting the layer to a different thickness of a material in which point defects can occur, and the thus obtained point defect distribution coincides with that obtained by the Monte Carlo simulation method.

What is claimed is:

1. An ion implantation simulation method for obtaining an impurity distribution and a point defect distribution to be generated by ion implantation in each layer of a multilayer substrate by simulation using analytical equations comprising the steps of:

determining the point defect distribution in a layer of the multilayer substrate assuming that the ion implantation generates point defect distribution so as to satisfy the relationship between the point defect distribution and the impurity distribution, according to the following equation:

$$\int_{xsk}^{\infty} f_{dk}(x)\,dx = F_k \int_{xsk}^{\infty} f_d(x)\,dx$$

wherein, $f_{dk}(x)$ is the point defect distribution for the k-th layer, $f_k(x)$ is the impurity distribution for the k-th layer, $F_k$ is (total amount of point defects)/(total amount of impurities) for the k-th layer, x is the coordinate in the depthwise direction of the multilayer substrate, and $xs_k$ is the transformed surface coordinate of a layer for which the material is converted into that of the k-th layer of the substrate;

wherein said $F_k$ is obtained in advance using the impurity distribution $f(x)$ and the point defect distribution $f_d(x)$ of a bare semiconductor substrate or a semiconductor substrate with a thin film in which point defects are not defined by calculation based on the Monte Carlo ion implantation simulation method for conditions in which channeling does not occur, according to the following equation:

$$F_k = \frac{\int_0^{\infty} f_d(x)\,dx}{\int_0^{\infty} f(x)\,dx}.$$

2. An ion implantation simulation method for determining an impurity distribution and point defect distribution caused by ion implantation in each layer of the multilayer substrate by simulation using analytical equations comprising:

a first step for obtaining normalized impurity distribution for each layer of said multilayer substrate;

a second step for calculating an actual impurity distribution from said normalized impurity distribution;

a third step for obtaining a point defect distribution as a reference for the layer whose material defines the point defects; and a fourth step for calculating the actual point defect distribution from said point defect distribution as a reference under a condition in which channeling is inhibited.

3. The method of calculating the actual point defect distribution by simulation according to claim 2, wherein the actual point defect distribution is calculated by use of a ratio of a total amount of impurity defects and a total amount from the impurity distribution and the point defect distribution obtained by Monte Carlo ion implantation simulation calculation in advance and the actual impurity distribution obtained in said second step.

4. The ion implantation simulation method according to claim 2, wherein the normalized impurity distribution in the first step is obtained by using any of a Gaussian distribution, a Pearson distribution, and a Dual Pearson distribution.

5. The ion implantation simulation method according to claim 2, wherein said third step determines the point defect distribution as a reference by use of any of the Gaussian distribution, the Pearson distribution, and the Dual Pearson distribution, and the point defects distribution is not normalized.

* * * * *